United States Patent
Gharpurey

(10) Patent No.: US 11,843,242 B1
(45) Date of Patent: Dec. 12, 2023

(54) HIGH VOLTAGE DC FAULT DETECTION

(71) Applicant: 4EST INC, Olympia, WA (US)

(72) Inventor: Ranjit Gharpurey, Austin, TX (US)

(73) Assignee: 4EST INC, Olympia, WA (US)

( * ) Notice: Subject to any disclaimer, the term of this patent is extended or adjusted under 35 U.S.C. 154(b) by 0 days.

(21) Appl. No.: 18/056,960

(22) Filed: Nov. 18, 2022

(51) Int. Cl.
  *H02H 7/00* (2006.01)
  *H02H 7/26* (2006.01)
  *G01R 31/52* (2020.01)
  *H02J 3/36* (2006.01)

(52) U.S. Cl.
  CPC ............. *H02H 7/268* (2013.01); *G01R 31/52* (2020.01); *H02J 3/36* (2013.01)

(58) Field of Classification Search
  None
  See application file for complete search history.

(56) References Cited

U.S. PATENT DOCUMENTS

| | | | |
|---|---|---|---|
| 8,068,937 B2 | 11/2011 | Eaves | |
| 2012/0075759 A1 | 3/2012 | Eaves | |
| 2013/0103220 A1 | 4/2013 | Eaves | |
| 2016/0329702 A1* | 11/2016 | Sun | H02H 9/004 |
| 2018/0313886 A1 | 11/2018 | Mlyniec et al. | |
| 2020/0100440 A1* | 4/2020 | Micu | G05B 19/042 |

* cited by examiner

*Primary Examiner* — Stephen W Jackson
(74) *Attorney, Agent, or Firm* — Kolitch Romano Dascenzo Gates LLC

(57) ABSTRACT

An automatic line integrity monitoring system may include a cable having a plurality of wires, and a controller configured to sequentially swap each wire of the cable from a main power supply to an auxiliary power supply. The controller further checks each wire for a current flow while the wire is connected to the auxiliary power supply, and, in response to the current flow satisfying a criterion, automatically disconnect the cable from the main power supply. The criterion may, for example, be an amperage threshold.

20 Claims, 5 Drawing Sheets

HIGH VOLTAGE DC FAULT DETECTION

FIELD

This disclosure relates to systems and methods for providing safety in a high voltage environment. More specifically, the disclosed embodiments relate to automatic fault monitoring in the field of direct current (DC) power transmission.

INTRODUCTION

User and appliance safety are key considerations when employing higher voltage direct current (DC) electrical systems. In existing residential designs, when an appliance using alternating current (AC) is turned on or has its state modified, the state change is typically done blindly under the assumption that the AC supply is an ideal infinite energy source. Two protection schemes are implemented. In a first, if the AC mains get overloaded with excessive current draw a line circuit breaker trips. Homes are generally divided into multiple AC subcircuits, where each subcircuit has a trip limit of 15-20 amps (A). This circuit breaker arrangement is configured to protect appliances and prevent overheating of the electrical wiring.

Second, ground fault circuit interrupters (GFCI) or residual current devices (RCDs) are configured to detect the presence of a spurious current path between AC or DC live lines and earth ground, and shut off the supply if such a spurious path is detected. This could happen if a person contacts the live wire and ground, in which case the current on the forward and return paths (live and neutral in AC, and positive and negative or appliance ground lines in DC) would be different. GFCI circuits sense such a current error over a selected threshold (usually approximately 5 mA) and disconnect (trip) the supply within a specified time limit (usually on the order of several seconds).

Better safety and fault monitoring systems are needed, for both AC and DC applications.

SUMMARY

The present disclosure provides systems, apparatuses, and methods relating to automatic detection of fault conditions (e.g., shorts to ground, line-to-line shorts, and spurious resistive paths between line-to-ground and line-to-line) employing a multi-wire cable.

In some examples, an automatic line integrity monitoring system includes: a multi-wire cable comprising a plurality of wires; and a controller configured to: sequentially swap each wire of the multi-wire cable from a main power supply to an auxiliary power supply, check each wire for a current flow while the wire is connected to the auxiliary power supply, and in response to the current flow satisfying a criterion, automatically disconnect the cable from the main power supply.

In some examples, an automatic line integrity monitoring system includes: a cable having a plurality of conductors running a length of the cable; a first plurality of solid state switches configured to selectively disconnect each of the plurality of conductors from a first power supply having a first voltage; a second power supply having a second voltage; a second plurality of solid state switches configured to selectively connect each of the plurality of conductors to the second power supply; and an electronic controller configured to control the first plurality of switches and the second plurality of switches to swap one of the conductors from the first power supply to the second power supply while others of the conductors remain connected to the first power supply, and further configured to check for a current in the one conductor while the one conductor is connected to the second power supply.

Features, functions, and advantages may be achieved independently in various embodiments of the present disclosure, or may be combined in yet other embodiments, further details of which can be seen with reference to the following description and drawings.

DETAILED DESCRIPTION

Figure 1:
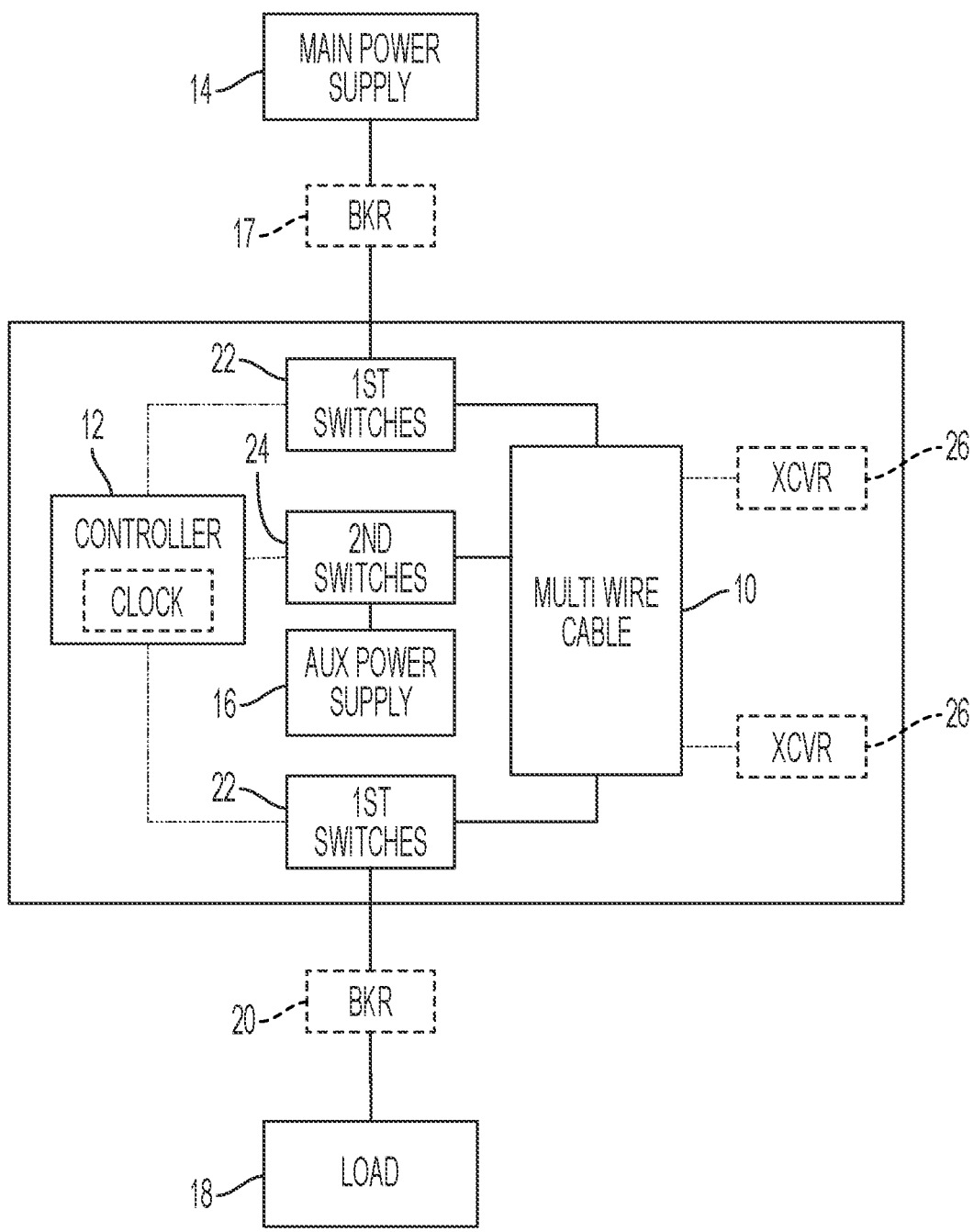
FIG. 1 is a schematic diagram of a line integrity monitoring system in accordance with aspects of the present disclosure.

Various aspects and examples of an electrical power transmission system having line integrity monitoring, as well as related methods, are described below and illustrated in the associated drawings. Unless otherwise specified, a line fault detection and monitoring system in accordance with the present teachings, and/or its various components, may contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

This Detailed Description includes the following sections, which follow immediately below: (1) Definitions; (2) Overview; (3) Examples, Components, and Alternatives; (4) Advantages, Features, and Benefits; and (5) Conclusion. The Examples, Components, and Alternatives section is further divided into subsections, each of which is labeled accordingly.

Definitions

The following definitions apply herein, unless otherwise indicated.

"Comprising," "including," and "having" (and conjugations thereof) are used interchangeably to mean including but not necessarily limited to, and are open-ended terms not intended to exclude additional, unrecited elements or method steps.

Terms such as "first", "second", and "third" are used to distinguish or identify various members of a group, or the like, and are not intended to show serial or numerical limitation.

"AKA" means "also known as," and may be used to indicate an alternative or corresponding term for a given element or elements.

"Coupled" means connected, either permanently or releasably, whether directly or indirectly through intervening components.

"Processing logic" describes any suitable device(s) or hardware configured to process data by performing one or more logical and/or arithmetic operations (e.g., executing coded instructions). For example, processing logic may include one or more processors (e.g., central processing units (CPUs) and/or graphics processing units (GPUs)), microprocessors, clusters of processing cores, FPGAs (field-programmable gate arrays), artificial intelligence (AI) accelerators, digital signal processors (DSPs), and/or any other suitable combination of logic hardware.

A "controller" or "electronic controller" includes processing logic programmed with instructions to carry out a controlling function with respect to a control element. For example, an electronic controller may be configured to receive an input signal, compare the input signal to a selected control value or setpoint value, and determine an output signal to a control element (e.g., a motor or actuator) to provide corrective action based on the comparison. In another example, an electronic controller may be configured to interface between a host device (e.g., a desktop computer, a mainframe, etc.) and a peripheral device (e.g., a memory device, an input/output device, etc.) to control and/or monitor input and output signals to and from the peripheral device.

"Providing," in the context of a method, may include receiving, obtaining, purchasing, manufacturing, generating, processing, preprocessing, and/or the like, such that the object or material provided is in a state and configuration for other steps to be carried out.

In this disclosure, one or more publications, patents, and/or patent applications may be incorporated by reference. However, such material is only incorporated to the extent that no conflict exists between the incorporated material and the statements and drawings set forth herein. In the event of any such conflict, including any conflict in terminology, the present disclosure is controlling.

Overview

In general, a high voltage direct current (HVDC) transmission system in accordance with the present teachings may include a line integrity testing and monitoring system configured to detect spurious current paths in a composite cable during power transmission, and to disconnect power automatically when a fault is detected. As used herein, "high voltage" DC includes voltage sources in the range of several hundreds of volts configured to deliver power up to several kilowatts to drive, for example, household appliances. On the other hand, "low voltage" DC includes voltages in the range of several tens of volts. A typical high voltage source is assumed to provide 400V in the examples below, while the low-voltage source is assumed to provide around 40-80V supply. However, systems and methods of the present disclosure may be utilized with any suitable voltages, where a "high voltage" is defined relative to (i.e., higher than) a "low voltage."

A GFCI system measures error currents of non-zero magnitude that flow between the live wire and ground, which is the difference between the forward and return current paths. For practical purposes, an unintentional path between the forward and return lines cannot be distinguished from the actual load and thus does not cause GFCI to trip. For example, if a load is consuming 5 A and a human makes a contact between forward and return, the current may increase to 5.01 A. However, it is impractical to determine if the excess 10 mA current is due to the spurious path or a normal change in load requirements.

It is possible in theory to place current and voltage sensors at both the source and the intended load, measuring and comparing these quantities continuously. The error between the source and intended load could be monitored. However, this approach is very challenging in a practical implementation, because the precision required of such measurements is extremely high. For example, if the quiescent current in the line is 10 A, measuring 5 mA implies a 12-bit accuracy requirement in the measurement electronics. While this is not impossible with modern data-converter technologies, especially given that the update rates are of the order of hundreds of μs, it is not a trivial task. The current sensors need to be 13-bit linear and accurate, over variations in temperature and aging, which is a more challenging requirement. Such sensors would require frequent calibration cycles, since any error could pose unacceptable risk. If the measurement accuracy falls to 11 bits instead of 12 bits, the measurement error could exceed the safety threshold.

For several decades, a combination of circuit breakers and GFCI functionality have been the standard for circuit safety. However, in a battery-powered design where appliances are driven from a finite energy source, it is undesirable for the DC current demand of an appliance or similar powered device to overload the battery since this can impact other appliances on the grid and damage the battery itself. As such, an approach based on coarse circuit breakers with large peak current margins is insufficient.

Furthermore, if energy travels through a spurious path modeled by a resistor R, then the amount of energy in time $\Delta T$ goes as $V^2 \Delta T/R$. Thus, increasing the voltage supply to reduce line losses leads to a quadratic increase in energy delivered through the spurious path. To keep the energy constant, the time $\Delta T$ for which the current flows must vary as $V^{-2}$.

For GFCI circuits, the required time to trip the circuit interrupter must be decreased as $I^\alpha$, where $\alpha>1$. The requirement for nonlinearly increasing functional dependence of switching time on spurious-path currents makes electromechanical switches increasingly impractical as the voltage level is increased. Moreover, electromechanical DC circuit breakers also require special designs to provide arc suppression.

These issues are difficult to address using electromechanical means. However, recent enhancements in high-power solid-state technology, such as fast-switching, high-voltage silicon MOSFET (metal-oxide-semiconductor field-effect transistor) and GaN-FET (or GaN FET) (gallium nitride field-effect transistor) devices, are utilized in systems of the present disclosure to provide new intelligent approaches to networking of appliances in a battery-supplied system. More generally, these approaches can be utilized in high-voltage DC and AC distribution systems.

For high voltage levels, it is desirable not only to employ the GFCI concept but also to provide protection, e.g., in the case of accidental (a) direct contact between forward and return wires, or (b) ungrounded contact to the conductor. The present disclosure combines appliance safety, networking, and power-utilization monitoring using a multi-phase power delivery scheme.

Systems of the present disclosure are configured to monitor a multi-line cable by sequentially isolating each power line from the HVDC power supply and the load, connecting the otherwise isolated line to a low voltage (LV) supply, and measuring any resulting current flow. The LV source may be at a fixed voltage level over the period of application, or may employ a voltage waveform that is stepped between two levels. If a fixed level is employed, the second source is referred to as LVDC. If a stepped voltage-waveform is used, the second source is referred to as LVS. Since the line should be isolated when connected to the LV source, there should be no current flow.

If a current is detected when using an LVDC source, then the problem can further be narrowed to either a spurious ground connection or a spurious HVDC line connection by checking the polarity of the current flow. This is because the LVDC source is higher than ground but lower than HVDC voltage, such that the current flow will be different in each situation. In some examples, simultaneous spurious connections to ground and HVDC lines are detected using a stepped LV source (LVS).

While the line isolation and testing are in progress, the remaining line or lines remain connected between the HVDC source and load. When a fault is detected, the system responds by disconnecting the cable from all power supplies. Sequencing and timing are controlled by a controller utilizing pulsed control signals to various solid-state switches.

In some examples, an automatic line integrity monitoring system of the present disclosure includes a cable comprising a plurality of wires; and a controller configured to: sequentially swap each wire in a multi-wire cable from a main power supply to an auxiliary power supply, check each wire for a current flow while the wire is connected to the auxiliary power supply, and, in response to the current flow satisfying a criterion, automatically disconnect the cable from the main power supply.

The automatic line integrity monitoring system may further include one or more of the following features:
  The wires comprise low-resistivity material(s) (e.g., copper wires).
  Each of the wires is isolated from the other conductors of the cable.
  The cable further includes a separate return wire at the reference or ground potential.
  The main power supply is a direct current (DC) power supply.
  The auxiliary power supply employs a fixed voltage-level or a two-level stepped voltage waveform.
  The main power supply voltage is higher than the auxiliary power supply voltage (or voltages, in cases where a two-level stepped voltage waveform is employed).
  The main power supply voltage is higher than the auxiliary power supply voltage (e.g., approximately 400 VDC).
  The auxiliary power supply voltage is lower than the main power supply voltage (e.g., approximately 50 VDC or a stepped voltage in the range 40-80V).
  The system includes a plurality of switches controlled by the controller. In some examples, the switches are solid-state (e.g., MOSFET or Gan FET switches).
  The controller is configured to control the plurality of switches using one or more clocked pulse waveforms.
  The cable is coupled to a load, and the controller is further configured to selectively disconnect each wire from the load while checking for the current flow.
  The electronic controller is further configured to connect temporarily a resistor in series with the auxiliary power source to dissipate residual line current.
  The plurality of wires include three or more of the wires.
  One or more sensors are configured to detect the current.
  The threshold is less than 1.0 mA, in some examples the threshold is 0.6 mA, and in some examples the threshold is zero amps.
  Processing logic is included to facilitate communication over at least one of the wires while the wire is connected to the auxiliary power supply. For example, the processing logic may control a pair of transceivers at each end of the cable, and may send communication information using a modulated (e.g., amplitude-modulated) signal. The communication signal may be utilized to synchronize the clocking of switches at different locations in the system.
  The synchronization signal may be directly derived from the switching DC levels on the wires themselves.
  Diodes or switches may be utilized at the load-end of the wires. (Diodes may be beneficial, as diodes turn on and off based on voltage levels, and therefore do not need synchronization clocks.)

In some examples, an automatic line integrity monitoring system of the present disclosure includes a cable having a plurality of conductors running a length of the cable; a first plurality of solid state switches configured to selectively disconnect each of the plurality of conductors from a first power supply having a first voltage; a second power supply having a second voltage or a stepped two-level voltage waveform; a second plurality of solid state switches configured to selectively connect each of the plurality of conductors to the second power supply; and an electronic controller configured to control the first plurality of switches and the second plurality of switches to swap one of the conductors from the first power supply to the second power supply while others of the conductors remain connected to the first power supply, and further configured to check for a current in the one conductor while the one conductor is connected to the second power supply.

The automatic line integrity monitoring system may further include one or more of the following features:
  The conductors comprise low-resistivity material(s) (e.g., copper wires).
  Each of the conductors is isolated from the other conductors of the cable.
  The cable further includes a separate return conductor.
  The first power supply is a direct current (DC) power supply.
  The second power supply is a DC power supply.
  The second power supply is a stepped two-level voltage waveform.
  The first voltage is higher than the second voltage.
  The first voltage is approximately 400 VDC.
  The second voltage is approximately 50 VDC.
  The second voltage is a stepped two-level voltage waveform having approximate values of 40V and 80V.

The first and/or second plurality of switches are solid state switches, e.g., MOSFET or Gan FET switches.

The first plurality of switches are further configured to selectively disconnect each of the plurality of conductors from a load.

The electronic controller is further configured to connect temporarily a resistor in series with the second power source to dissipate residual line current.

The plurality of conductors include three or more conductors.

One or more sensors are configured to detect current in one or more lines connecting the second power source to the conductors.

The electronic controller includes a clock, and the controller is configured to control the first and second plurality of switches using one or more clocked pulse waveforms.

The electronic controller is configured to automatically disconnect the cable from the first power supply in response to the current in the one conductor reaching a threshold (e.g., a threshold on the order of milliamps, e.g., a threshold of 0.6 mA).

Processing logic is included to facilitate communication over at least one of the wires while the wire is connected to the auxiliary power supply. For example, the processing logic may control a pair of transceivers at each end of the cable, and may send information (e.g., control or feedback or operational data) using a modulated (e.g., amplitude-modulated) signal. The communication signal may be utilized to synchronize the clocking of switches at different locations in the system.

The synchronization signal may be directly derived from the switching DC levels on the conductors themselves.

Diodes or switches may be utilized at the load-end of the conductors. (Diodes may be beneficial, as diodes turn on and off based on voltage levels, and therefore do not need synchronization clocks.)

In some examples, a method of monitoring an electrical cable for spurious currents includes, for each one of a plurality of conductors of an electrical cable: isolating the one conductor from a first power source having a first voltage; while the one conductor is isolated from the first power source, connecting the one conductor to a second power source having a second voltage or voltages lower than the first voltage; measuring current flow in the one conductor while the one conductor is connected to the second power supply; in response to the current flow reaching a selected threshold, automatically disconnecting the cable from the first power source; and in response to the current flow failing to reach the selected threshold, reconnecting the one conductor to the first power source.

The method may further include one or more of the following steps and/or features:

Cycling through each of the conductors sequentially, based on a clocked pulse timing scheme.

Isolating the one conductor from the first power source and connecting the one conductor to the second power source includes controlling a plurality of solid state switches.

Disconnecting the cable from the first power source includes tripping a circuit breaker.

Communicating a signal from a first position on the cable to a second position on the cable over at least one of the wires while the wire is connected to the auxiliary power supply. For example, a pair of transceivers at each end of the cable may send information using a modulated (e.g., amplitude-modulated) signal. In some examples, the communication signal is utilized to synchronize aspects of the system (e.g., the clocking of switches at different locations).

One or more aspects of line integrity testing and monitoring systems of the present disclosure may be embodied as a computer method, computer system, or computer program product. Accordingly, aspects of the system may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of the system may take the form of a computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a computer-readable storage medium may include any suitable non-transitory, tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, RF, and/or the like, and/or any suitable combination of these.

Computer program code for carrying out operations for aspects of the system may be written in one or any combination of programming languages, including an object-oriented programming language (such as Java, C++), conventional procedural programming languages (such as C), and functional programming languages (such as Haskell). Mobile apps may be developed using any suitable language, including those previously mentioned, as well as Objective-C, Swift, C#, HTML5, and the like. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), and/or the connection may be made to an external computer (for example, through the Internet using an Internet Service Provider).

Aspects of the system may be described below with reference to flowchart illustrations and/or block diagrams of methods, apparatuses, systems, and/or computer program products. Each block and/or combination of blocks in a flowchart and/or block diagram may be implemented by computer program instructions. The computer program instructions may be programmed into or otherwise provided to processing logic (e.g., a processor of a general purpose computer, special purpose computer, field programmable gate array (FPGA), or other programmable data processing apparatus) to produce a machine, such that the (e.g., machine-readable) instructions, which execute via the processing logic, create means for implementing the functions/acts specified in the flowchart and/or block diagram block(s).

Additionally or alternatively, these computer program instructions may be stored in a computer-readable medium that can direct processing logic and/or any other suitable device to function in a particular manner, such that the instructions stored in the computer-readable medium produce an article of manufacture including instructions which implement the function/act specified in the flowchart and/or block diagram block(s).

The computer program instructions can also be loaded onto processing logic and/or any other suitable device to cause a series of operational steps to be performed on the device to produce a computer-implemented process such that the executed instructions provide processes for implementing the functions/acts specified in the flowchart and/or block diagram block(s).

Any flowchart and/or block diagram in the drawings is intended to illustrate the architecture, functionality, and/or operation of possible implementations of systems, methods, and computer program products according to aspects of the present system. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

EXAMPLES, COMPONENTS, AND ALTERNATIVES

The following sections describe selected aspects of illustrative line integrity testing and monitoring systems, as well as related systems and/or methods. The examples in these sections are intended for illustration and should not be interpreted as limiting the scope of the present disclosure. Each section may include one or more distinct embodiments or examples, and/or contextual or related information, function, and/or structure.

A. Illustrative K-Conductor Cable for Safe Delivery of HVDC

As shown in FIGS. 1-5, this section describes illustrative electrical systems having automatic fault detection and monitoring. These systems are examples of the systems described in the overview above.

FIG. 1 is a schematic diagram of an illustrative DC power system configured to provide automatic fault detection. A multi-wire cable 10 has a plurality of wires, including two or more forward conductors and one return conductor. A controller 12 is configured to sequentially swap each wire of multi-wire cable 10 from a main power supply 14 to an auxiliary power supply 16. Each wire is checked for a current flow while the wire is connected to the auxiliary power supply. In response to the current flow satisfying a criterion, controller 12 is configured to automatically disconnect the cable from the main power supply 14 (e.g., using a circuit breaker 17 and/or first switches 22) and in some cases also from a load 18 (e.g., using a circuit breaker 20). The controller uses first switches 22 to selectively isolate each wire from the main power supply and the load, during testing. The controller uses second switches 24 to selectively connect each wire to the auxiliary power supply to check for spurious or erroneous current flow. In some examples, a pair of transceivers 26 are utilized to communicate information on the low voltage lines (i.e., when the wires are connected to the auxiliary power supply), using a modulated signal.

Figure 2:
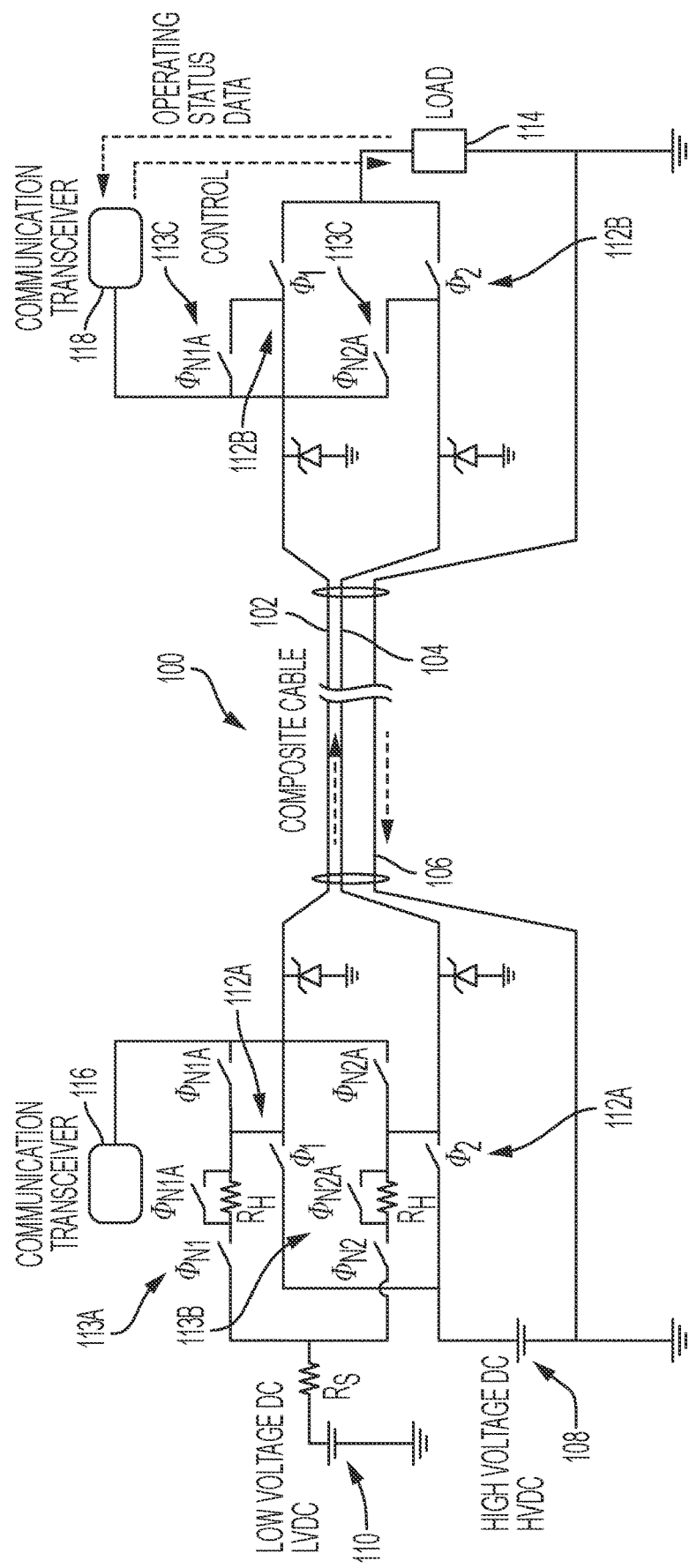
FIG. 2 is a circuit diagram depicting a first illustrative electrical system having a two-wire cable with automatic fault detection and monitoring in accordance with aspects of the present disclosure.

FIG. 2 is a circuit diagram of an illustrative DC cable 100 configured to provide GFCI-like functionality and to detect contact between forward and return paths. The return path is set at the reference voltage level. Cable 100 includes K forward wires (here, K=2 resulting in wires 102 and 104), and one return wire 106. Wires 102, 104 are connected to a high-voltage DC (HVDC) power supply 108 and a low-voltage DC (LVDC) power supply 110 through switches 112A, 112B, 113. Switches 112A, 112B, 113 may include any suitable solid state switches configured to quickly and controllably connect or disconnect the wires from supply 108, supply 110, and/or a load 114. In some examples, switches 112A, 112B, and/or 113 are implemented as GaN FETs or silicon MOSFETs.

In some examples, as depicted in FIG. 2, respective instances of switch 112A and switch 112B are disposed in the current path of each wire (102,104), with switch 112A at the power source end and switch 112B at the load end. In some examples, switch 112B is replaced by a diode, arranged such that the anode terminal is connected to the supply line and the cathode is connected to the load. When diodes are utilized, synchronization requirements are reduced, as synchronization for the switches in the current path at the load end is not needed. However, when diodes are used, voltage at the load is reduced by the diode forward voltage drop.

Figure 3:
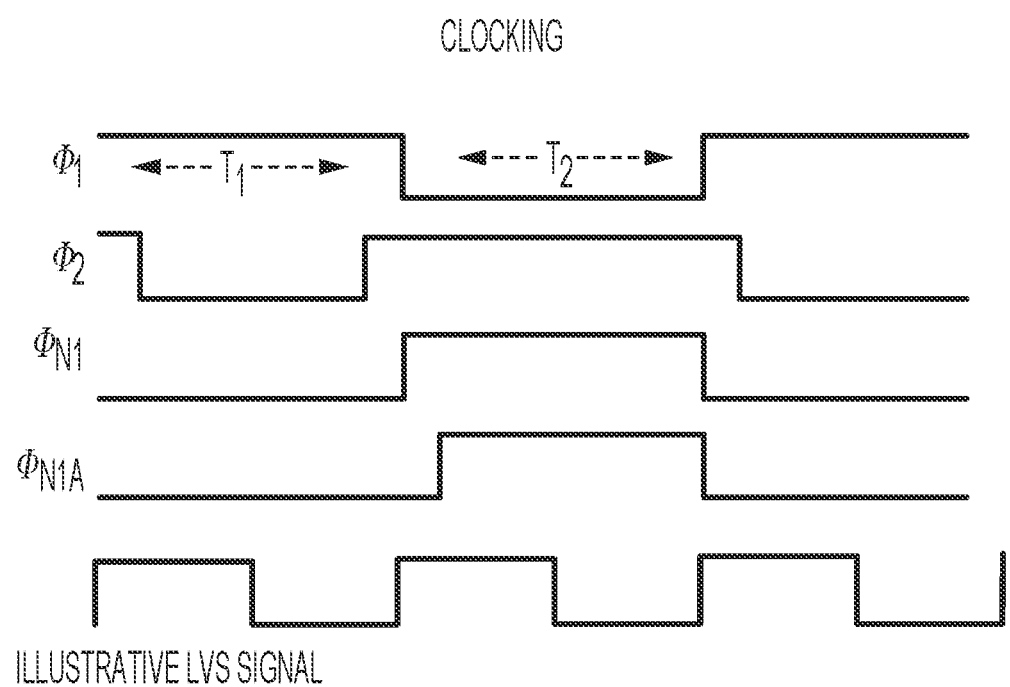
FIG. 3 is an illustrative clocked pulse scheme suitable for use in the circuit of FIG. 2.

Switches 112A, 112B, and 113A, 113B, 113C (when present) may be controlled using any suitable mechanism (e.g., a controller) and/or method. In some examples, switches 112A, 112B, 113A, 113B, 113C are clocked using pulse waveforms (see FIG. 3 at $\varphi_k$). An illustrative pulsed waveform scheme is depicted in FIG. 3, where $\varphi_1$ corresponds to wire 1 (102) and $\varphi_2$ corresponds to wire 2 (104), and each wire k is connected to HVDC power supply 108 and load 114 during phase $\varphi_k$. In contrast, during each $\varphi_{Nk}$ wire k is disconnected from HVDC supply 108 and load 114.

In some examples, phase $\varphi_{Nk}$ (where wire k is isolated from the HVDC supply and from the load) is split into two parts, with the second part designated as phase $\varphi_{NkA}$. In a first part, switches 112A, 112B, 113A, 113B and 113C are arranged such that wire k is connected to LVDC power supply 110 through a large resistance ($R_H + R_S$) to minimize the settling time of the wire current and voltage transients that result from disconnecting the wire from the HVDC supply. In second part $\varphi_{NkA}$ of phase $\varphi_{Nk}$, switches 112A, 112B, 113A, 113B and 113C are arranged such that $R_H$ is shorted and the total resistance is lowered to $R_S$ to reset the line voltage to LVDC. The use of $R_H$ effectively synthesizes a time-varying resistance, which is used for optimizing the transient response of the lines. In second part $\varphi_{NkA}$, wire k should be isolated from the load, such that there should be no line current flowing from LVDC source 110A. Accordingly, if current is detected then a fault condition is indicated. In some examples, automatic disconnection from HVDC source 108 (switching off all power) is triggered whenever a measured current reaches a selected threshold. In some examples, disconnection from all power sources is triggered. Switches 113B placed across $R_H$ may be omitted, depending on the values of the inductance and capacitance of the wires. A voltage clamp circuit with clamp voltage higher than HVDC may be employed on the source and load side on each wire, as shown in FIG. 2 to limit peak voltage transients.

A fault condition threshold may be set at a measured DC current greater than or equal to a fraction of the undesired level at full power, where the fraction is equivalent to the ratio between the lower LVDC voltage and the higher HVDC voltage. For example, when LVDC is at 50V and HVDC is at 400V, the threshold may be set at 0.6 mA. Since this current is presumed to be at the LVDC voltage level, a 0.6 mA current corresponds to an approximately 5 mA threshold at the high voltage level. (0.6~50/400×5). This is also a safe threshold in situations where the fault is a short to the high-voltage line.

The duration of second portion $\varphi_{NkA}$ and overall phase $\varphi_{Nk}$ are determined using values of expected line inductance and capacitance.

LVDC voltage is chosen to be different than HVDC voltage during phase $\varphi_{Nk}$. Choosing a magnitude of LVDC voltage that is between ground and HVDC voltage ensures that a spurious short or spurious resistive path between two forward lines can be detected as well as a short or a spurious path to ground. This is because a short or a spurious resistive path to ground will result in a current in the LVDC source that has a different polarity than that caused by a short or a spurious resistive path to an HVDC line. In other words, the measured polarity of a current flow during phase $\varphi_{NkA}$ will determine if the current is flowing because of HVDC or a spurious load to ground.

Periodicity of the clocking can be kept under a selected value, e.g., 5 milliseconds (ms), to ensure rapidly recurring line testing. If multiple loads are employed, these can use synchronized phases for their lines to detect fault conditions.

The above-described approach provides continuous conductor contact from the supply to the load, with minimal ripple on the powerline. An electronic control system (e.g., controller) may be configured to handle the switching logic for operation.

In some examples, if spurious resistive paths can exist simultaneously between the forward wires as well as between the forward wires and the return path or ground, a two-level stepped, low-voltage signal source (LVS) may be employed instead of (i.e., in place of) the fixed LVDC supply 110. A fixed-level LVDC source may be insufficient for leakage detection in such cases. Using the example of FIG. 4 (described below), given an illustrative HVDC level of 400 VDC and fixed LVDC level of 50 VDC, if the resistive path between the forward lines has seven times the resistance compared to the resistance between a forward path and the return path, no current will be observed flowing in the LVDC source. This may be a rare situation. However, utilizing a two-level low-voltage source addresses the issue by using two independent low voltage levels to determine the strength of the two resistive paths, namely the paths between forward wires, and a forward-path wire and the return path, respectively. To accomplish this, the voltage step in LVS may be applied at instants that are nearly half of the duration of clock phase $\varphi_{Nk}$. See illustrative waveform shown at the bottom of FIG. 3. In other words, the voltage of the LVS may experience a step change during clock phase $\varphi_{Nk}$ instead of being at a fixed level if an LVDC source is used.

Three additional losses are introduced in excess of the $I^2R$ loss of the wires, although these losses are quite small even in the aggregate. The first additional loss is the loss in the switches. This loss is small because the resistance of high power switches is on the order of tens of milliohms (mΩ). In an example, with 100 ms) of switch losses for a 10 A current, the loss is 10 watts (W). A typical value of load may be in the range of 10 s of Ωs. For example, if the load has a value of 40Ω, the power delivered to the load is 4 kW. 10 W is a small fraction of 4 kW delivered to the load. Other loss mechanisms arise from the periodic stepping of line current and voltage. These losses are similarly insignificant with respect to the overall wattages involved, for typical line inductance and capacitance, even over long wire runs of the order of hundreds of feet.

With a cable having two conductors, as in the example above, the number of wires in the forward path is doubled as compared with a standard cable, while effectively half of the ampere capacity of the overall cable is utilized. This situation can be improved by using a cable including more individual wires, i.e., where K>2.

Figure 4:
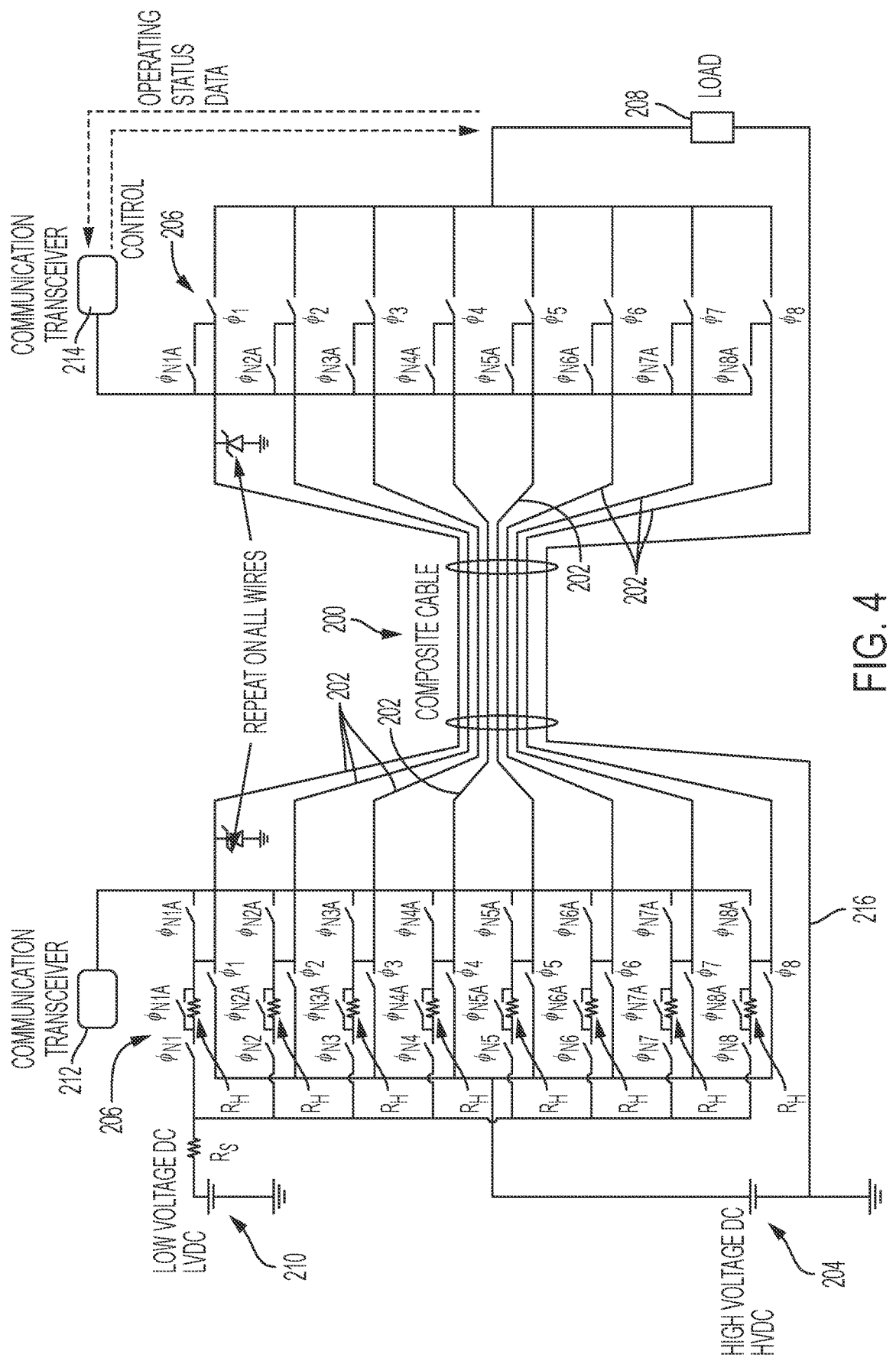
FIG. 4 is a circuit diagram depicting a second illustrative electrical system having an eight-wire cable with automatic fault detection and monitoring in accordance with aspects of the present disclosure.
Figure 5:
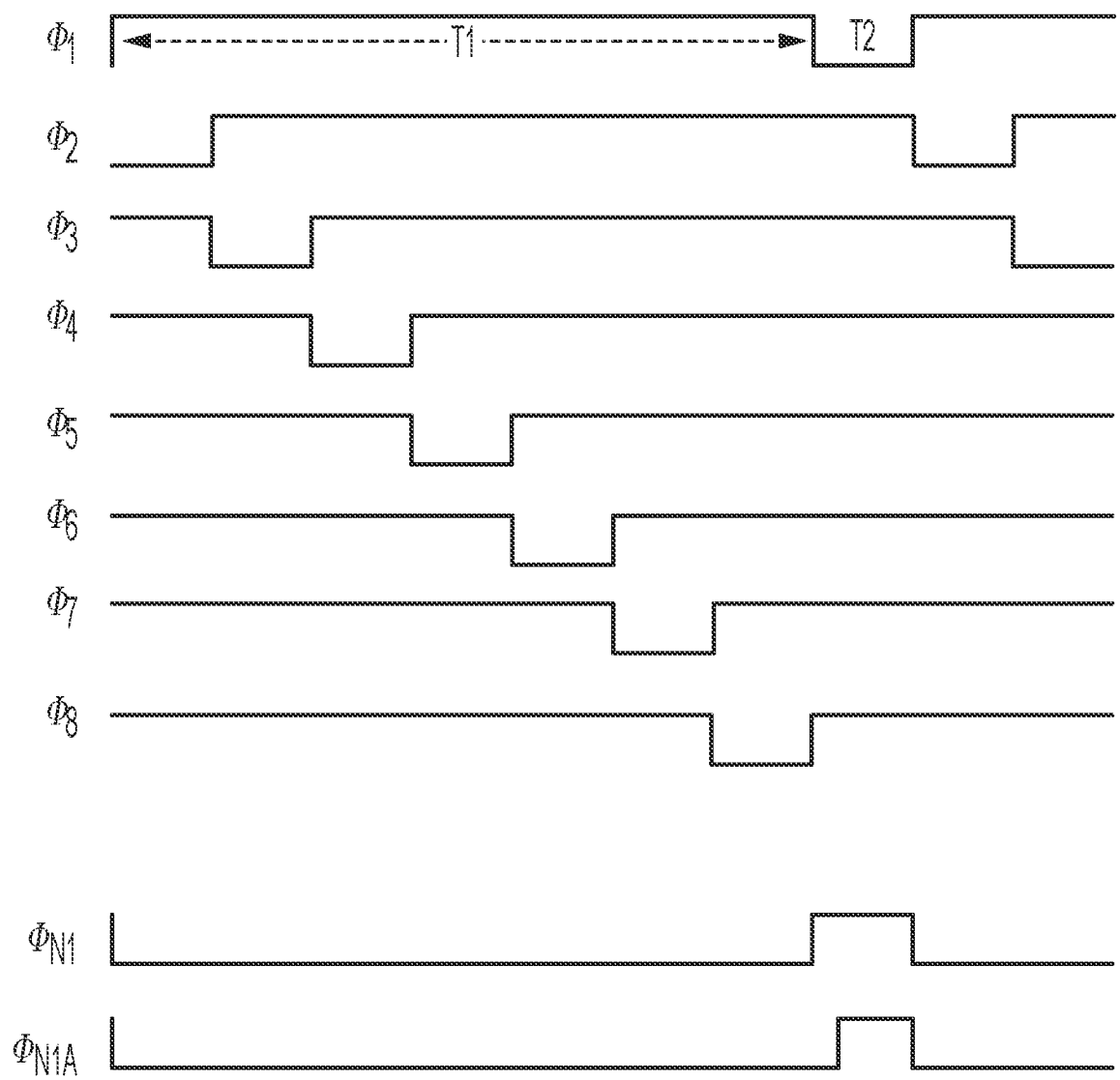
FIG. 5 is an illustrative clocked pulse scheme suitable for use in the circuit of FIG. 4.

Turning to FIG. 4, a cable 200 is depicted where K=8. Eight wires 202 are connected to a high-voltage DC (HVDC) supply 204 through switches 206. Cable 200 further includes a return line 216. Switches 206 are clocked using pulse waveforms, as shown in FIG. 5 (see phases $\varphi_1$-$\varphi_8$). In this example, seven cables are connected to the HVDC supply at any given time, providing power to a load 208. If $T_1$=the length of time any given wire is connected and providing power to the load, and $T_2$=the length of time a wire is disconnected for fault detection, then $T_1$ may be given as $(K-1) \times T_2$. For example, with K=8, $T_1 = 7T_2$. However, $T_2$ may not be a constant in some examples.

As in the example of cable 100, the system cycles through each of the wires 202 within cable 200, connecting the wire to a low-voltage DC (LVDC) supply 210. Similar to the case for k=2 described above, a two-level stepped voltage source (LVS) may be used if the potential exists for simultaneous resistive paths between forward-path wires, and forward-path and return-path wires. As outlined above, the step can be applied at time instants corresponding to half of the pulse duration of clock phase $\varphi_{Nk}$.

Wire k is connected to the LVDC supply in phase $\varphi_{Nk}$, which is divided into two parts as described above. The first part, immediately after phase $\varphi_{Nk}$ is enabled, provides a high-impedance connection to wire k through a large resistance $R_H$, depending on the wire inductance. In the second part, corresponding to phase $\varphi_{NkA}$, wire k is connected to LVDC through a low series resistance $R_S$. When phase $\varphi_{Nk}$ goes high, the current through the line is rapidly reduced to zero. Then, in phase $\varphi_{NkA}$, the line voltage is set to LVDC. If current flow is observed during phase $\varphi_{NkA}$, this indicates that a fault exists. The relative width of the pulses $\varphi_{NkA}$ and $\varphi_{Nk}$ is determined based on the line inductance and capacitance, and may be adjusted as desired. Similarly, depending on the inductance and capacitance or the wires, the switches placed across $R_H$ may be omitted entirely. As described above, LVDC voltage is selected to facilitate the detection of a short condition or resistive path between line k and any other line or between line k and ground. Switches 206 disposed in the current path of wires 202 at the load end may be replaced by diodes, as described above with respect to switches 112B in FIG. 2. A voltage clamp circuit with clamp voltage higher than HVDC may be employed on the source and load side on each wire, as shown in FIG. 4 to limit peak voltage transients.

Selecting a high ratio of conducting to non-conducting wires facilitates a reduced thickness of any given wire, for a required current capacity or density, such that the overall thickness of the cable is similar to a standard cable. For example, with K=8, seven conductors are used for power delivery at any given time, and each of the eight conductors only requires the current capacity of ⅐ of the overall cable. Thus, the total thickness of the cable is similar to one of the same capacity using a single conductor. On the other hand, with lower values of K, the sampling time for current detection may be relaxed.

In some examples, the system includes a communication feature in which the low voltage lines are utilized to send a modulated signal between two points (e.g., two ends) of the cable. For example, the system may include a pair of transceivers (116, 118 in FIGS. 2 and 212, 214 in FIG. 4) controlled by processing logic (e.g., one or more microcontrollers) to send a modulated signal over the line when each wire in the cable is isolated from high voltage and connected to the low voltage. The signal may be amplitude-modulated. In some examples, the data transmitted includes information or commands from or about the load to the supply controller.

Accordingly, the load (e.g., a smart appliance) is enabled to provide real time power and state information to the controller of the high voltage power supply. This data may include instantaneous voltage, current, power dissipation, and/or any change or expected change to the usage. The information is used for monitoring and controls. For example, an induction stove (the load in this example) may be configured to communicate any desired change in state to the power supply, e.g., in the form of a request. If sufficient power is unavailable, the supply controller may be configured to command or request that the appliance to remain in the current mode until adequate power becomes available. This design may utilize a protocol similar or analogous to powerline communications for information flow between the appliance and the supply.

Specifically, the communication may be carried out during phase $\varphi_{NkA}$, using the line that is disconnected from HVDC. In this example, a modulated carrier is employed to communicate on the LV power line during this phase. The carrier may also be configured to provide clock synchronization between the source and appliance ends of the system, to ensure proper timing of the various switches. In general, timing errors are constrained between the source and the appliance as these errors could lead to spurious current flows and measurement errors.

B. Illustrative Method

This section describes steps of an illustrative method for automatically detecting faults in a multi-wire cable. Aspects of the systems described above may be utilized in the method steps described below. Where appropriate, reference may be made to components and systems that may be used in carrying out each step. These references are for illustration, and are not intended to limit the possible ways of carrying out any particular step of the method.

For each one of a plurality of conductors of an electrical cable:

A first step of the method includes isolating the one conductor from a first power source having a first voltage.

A second step of the method includes, while the one conductor is isolated from the first power source, connecting the one conductor to a second power source having a second voltage or a two-step voltage having levels lower than the first voltage. This step may include controlling a plurality of solid state switches.

A third step of the method includes measuring current flow in the one conductor while the one conductor is connected to the second power supply.

A fourth step of the method includes, in response to the current flow reaching a selected threshold (e.g., approximately 1 mA or less), automatically disconnecting the cable from the first power source. Disconnecting the cable from the first power source may include tripping a circuit breaker and/or disabling all solid-state switches in the path of the conductors.

A fifth step of the method includes, in response to the current flow failing to reach the selected threshold, reconnecting the one conductor to the first power source.

The above method may include cycling through each of the conductors sequentially, based on a clocked pulse timing scheme.

In some examples, the method may further include communicating a signal from a first position on the cable to a second position on the cable over at least one of the wires while the wire is connected to the auxiliary power supply. In some examples, a pair of transceivers are connected to each end of the cable and configured to send information using a modulated (e.g., amplitude-modulated) signal. The method may further include utilizing the signal to synchronize aspects of the system (e.g., the clocking of switches at different locations).

C. Illustrative Combinations and Additional Examples

This section describes additional aspects and features of automatic line integrity monitoring systems, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

B0. An automatic line integrity monitoring system comprising:
   a multi-wire cable comprising a plurality of wires; and
   a controller configured to:
      sequentially swap each wire of the multi-wire cable from a main power supply to an auxiliary power supply,
      check each wire for a current flow while the wire is connected to the auxiliary power supply, and
      in response to the current flow satisfying a criterion, automatically disconnect the cable from the main power supply.

B1. The system of B0, wherein the wires comprise a conductive material (e.g., copper).

B2. The system of B0 or B1, wherein each of the wires is isolated from the other conductors of the cable.

B3. The system of any one of paragraphs B0 through B2, further comprising a separate return wire.

B4. The system of any one of paragraphs B0 through B3, wherein the main power supply is a direct current (DC) power supply.

B5. The system of any one of paragraphs B0 through B4, wherein the auxiliary power supply is a DC power supply.

B6. The system of any one of paragraphs B0 through B5, wherein the main power supply voltage is higher than the auxiliary power supply voltage.

B7. The system of B6, wherein the main power supply voltage is approximately 400 VDC.

B8. The system of B6 or B7, wherein the auxiliary power supply voltage is approximately 50 VDC.

B8A. The system of B6 or B7, wherein the auxiliary power supply voltage is a two-level stepped voltage having levels of approximately 40V and 80V.

B9. The system of any one of paragraphs B0 through B8, further comprising a plurality of switches controlled by the controller.

B10. The system of B9, wherein the switches are solid-state (e.g., MOSFET or Gan FET switches).

B11. The system of B9 or B10, wherein the controller is configured to control the plurality of switches using one or more clocked pulse waveforms.

B12. The system of any one of paragraphs B9 through B11, further comprising one or more diodes disposed in each wire of the multi-wire cable, such that the diodes are downstream of the switches.

B13. The system of any one of paragraphs B0 through B12, wherein the cable is coupled to a load, and the controller is further configured to selectively disconnect each wire from the load while checking for the current flow.

B14. The system of any one of paragraphs B0 through B13, wherein the electronic controller is further configured to connect temporarily a resistor in series with the auxiliary power source.

B15. The system of any one of paragraphs B0 through B14, wherein the plurality of wires include three or more of the wires.

B16. The system of any one of paragraphs B0 through B15, wherein one or more sensors are configured to detect the current.

B17. The system of any one of paragraphs B0 through B16, wherein the criterion is a current flow threshold less than 1.0 mA, in some examples the threshold is 0.6 mA, and in some examples the threshold is zero amps.

B18. The system of any one of paragraphs B0 through B17, further comprising processing logic configured to facilitate communication over at least one of the wires while the wire is connected to the auxiliary power supply.

B19. The system of B18, wherein the processing logic controls a pair of transceivers at each end of the cable.

B20. The system of B18 or B19, wherein the processing logic is configured to send information using a modulated (e.g., amplitude-modulated) signal.

B21. The system of any one of paragraphs B18 through B20, wherein the controller is further configured to synchronize system clocks using the communication signal.

C0. An automatic line integrity monitoring system, comprising:
- a cable having a plurality of conductors running a length of the cable;
- a first plurality of solid state switches configured to selectively disconnect each of the plurality of conductors from a first power supply having a first voltage;
- a second power supply having a second voltage or a pair of second voltages;
- a second plurality of solid state switches configured to selectively connect each of the plurality of conductors to the second power supply; and
- an electronic controller configured to control the first plurality of switches and the second plurality of switches to swap one of the conductors from the first power supply to the second power supply while others of the conductors remain connected to the first power supply, and further configured to check for a current in the one conductor while the one conductor is connected to the second power supply.

C1. The system of C0, wherein the conductors comprise a low-resistivity material (e.g., copper).

C2. The system of C0 or C1, wherein each of the conductors is isolated from the other conductors of the cable.

C3. The system of any one of paragraphs C0 through C2, further comprising a separate return conductor.

C4. The system of any one of paragraphs C0 through C3, wherein the first power supply is a direct current (DC) power supply.

C5. The system of any one of paragraphs C0 through C4, wherein the second power supply is a DC power supply or a stepped two-level voltage supply.

C6. The system of any one of paragraphs C0 through C5, wherein the first voltage is higher than the second voltage.

C7. The system of any one of paragraphs C0 through C6, wherein the first voltage is approximately 400 VDC.

C8. The system of any one of paragraphs C0 through C7, wherein the second voltage is approximately 50 VDC.

C8A. The system of any one of paragraphs C0 through C7, wherein the second voltage comprises two levels (e.g., at approximately 40V and 80V).

C9. The system of any one of paragraphs C0 through C8, wherein the first and/or second plurality of switches are solid state switches, e.g., MOSFET or Gan FET switches.

C10. The system of any one of paragraphs C0 through C9, wherein the first plurality of switches are further configured to selectively disconnect each of the plurality of conductors from a load.

C11. The system of any one of paragraphs C0 through C10, wherein the electronic controller is further configured to connect temporarily a resistor in series with the second power source.

C12. The system of any one of paragraphs C0 through C11, wherein the plurality of conductors include three or more conductors.

C13. The system of any one of paragraphs C0 through C12, wherein one or more sensors are configured to detect current in one or more lines connecting the second power source to the conductors.

C14. The system of any one of paragraphs C0 through C13, wherein the electronic controller includes one or more clocks, and the controller is configured to control the first and second plurality of switches using one or more clocked pulse waveforms.

C15. The system of any one of paragraphs C0 through C14, wherein the electronic controller is configured to automatically disconnect the cable from the first power supply in response to the current in the one conductor reaching a threshold (e.g., a threshold of approximately 1 mA).

C16. The system of any one of paragraphs C0 through C15, further comprising processing logic configured to provide communication over at least one of the wires while the wire is connected to the auxiliary power supply.

C17. The system of C16, wherein the processing logic controls a pair of transceivers at each end of the cable, and is configured to send information (e.g., control or feedback or operational data) using a modulated (e.g., amplitude-modulated) signal.

C18. The system of any one of paragraphs C0 through C16, wherein the controller is configured to utilize the communication signal to synchronize the clocking of switches at different locations in the system.

D0. A method for monitoring an electrical cable for spurious currents, the method comprising, for each one of a plurality of conductors of an electrical cable:
- isolating the one conductor from a first power source having a first voltage;
- while the one conductor is isolated from the first power source, connecting the one conductor to a second power source having a second voltage level or two stepped second voltage levels lower than the first voltage;
- measuring current flow in the one conductor while the one conductor is connected to the second power supply;
- in response to the current flow reaching a selected threshold, automatically disconnecting the cable from the first power source; and
- in response to the current flow failing to reach the selected threshold, reconnecting the one conductor to the first power source.

D1. The method of D0, further comprising:
- cycling through each of the conductors sequentially, based on a clocked pulse timing scheme.

D2. The method of D0 or D1, wherein isolating the one conductor from the first power source and connecting the one conductor to the second power source includes controlling a plurality of solid state switches.

D3. The method of any one of D0 through D2, wherein disconnecting the cable from the first power source includes tripping a circuit breaker.

D4. The method of any one of D0 through D3, further comprising:
- communicating a signal from a first position on the cable to a second position on the cable over at least one of the wires while the wire is connected to the auxiliary power supply.

D5. The method of D4, wherein a pair of transceivers at each end of the cable send information using a modulated (e.g., amplitude-modulated) signal.

D6. The method of D4, further comprising utilizing the signal to synchronize aspects of the system (e.g., the clocking of switches at different locations).

D7. The method of any one of D0 through D6, wherein the selected threshold is zero amps.

D8. The method of any one of D0 through D6, wherein the selected threshold is approximately 1 mA.

Advantages, Features, and Benefits

The different embodiments and examples of the electrical power delivery system having automatic fault detection described herein provide several advantages over known solutions. For example, illustrative embodiments and examples described herein allow effectively continuous testing and monitoring of the cable without interrupting power.

Additionally, and among other benefits, illustrative embodiments and examples described herein allow the system to automatically determine the type of fault (e.g., short to ground vs. short to high voltage line). Typical GFCI protection does not protect against human contact between forward and return wires, for example, as this cannot be distinguished from a load. However, some embodiments of the present disclosure can distinguish this situation, as described above.

Additionally, and among other benefits, illustrative embodiments and examples described herein include a communication mechanism between ends of the cable, e.g., to facilitate control and monitoring of the load and/or supply.

No known system or device can perform these functions, especially while providing a continuous current path from the power source to the load. However, not all embodiments and examples described herein provide the same advantages or the same degree of advantage.

CONCLUSION

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

The invention claimed is:

1. An automatic line integrity monitoring system comprising:
   a multi-wire cable comprising a plurality of wires; and
   a controller configured to:
      sequentially swap each wire of the multi-wire cable from a main power supply to an auxiliary power supply while the remaining wires are connected to the main power supply,
      check each wire for a current flow while the wire is connected to the auxiliary power supply, and
      in response to the current flow satisfying a criterion, automatically disconnect the cable from the main power supply.

2. The system of claim 1, wherein the main power supply comprises a constant level (DC) power supply and the auxiliary power supply comprises a constant level power supply or a two-level, stepped power supply.

3. The system of claim 1, wherein a voltage of the main power supply is higher than a voltage of the auxiliary power supply.

4. The system of claim 1, further comprising a plurality of switches, at least one of the switches disposed in each wire of the multi-wire cable and controlled by the controller, wherein the controller is configured to sequentially swap each wire of the multi-wire cable from the main power supply to the auxiliary power supply using the plurality of switches.

5. The system of claim 4, wherein the plurality of switches comprises solid-state switches.

6. The system of claim 4, further comprising one or more diodes disposed in each wire of the multi-wire cable, such that each of the one or more diodes is downstream of the at least one switch.

7. The system of claim 4, wherein the controller is configured to control the plurality of switches using one or more clocked pulse waveforms.

8. The system of claim 1, wherein the cable is coupled to a load, and the controller is further configured to selectively disconnect each wire from the load while checking for the current flow.

9. The system of claim 1, wherein the controller is further configured to connect temporarily a resistor in series with the auxiliary power supply to implement a time-varying resistance for dissipating residual line current.

10. The system of claim 1, further comprising processing logic configured to facilitate communication over at least one of the wires, while the wire is connected to the auxiliary power supply, using a modulated signal.

11. An automatic line integrity monitoring system, comprising:
- a cable having a plurality of conductors running a length of the cable;
- a first plurality of solid state switches configured to selectively disconnect each of the plurality of conductors from a first power supply having a first voltage;
- a second power supply having a second voltage or a pair of second voltage levels;
- a second plurality of solid state switches configured to selectively connect each of the plurality of conductors to the second power supply; and
- an electronic controller configured to control the first plurality of switches and the second plurality of switches to swap one of the conductors from the first power supply to the second power supply while others of the conductors remain connected to the first power supply, and further configured to check for a current in the one conductor while the one conductor is connected to the second power supply.

12. The system of claim 11, wherein the first voltage is higher than the second voltage or the pair of second voltage levels.

13. The system of claim 11, wherein the first plurality of switches and the second plurality of switches comprise solid-state switches.

14. The system of claim 13, further comprising a respective solid-state diode disposed in each conductor, wherein a cathode end of the diode is coupled to a load.

15. The system of claim 11, wherein the electronic controller is further configured to connect a resistor in series with the second power supply.

16. The system of claim 11, wherein the electronic controller includes one or more clocks, and the controller is configured to control the first and second plurality of switches using one or more clocked pulse waveforms.

17. The system of claim 11, wherein the electronic controller is configured to automatically disconnect the cable from the first power supply in response to the current in the one conductor reaching a threshold.

18. The system of claim 11, further comprising processing logic configured to provide communication over at least one of the conductors while the conductor is connected to the second power supply.

19. The system of claim 18, further comprising a pair of transceivers, a respective one of the transceivers being disposed at each end of the cable, wherein the processing logic is configured to communicate information between the pair of transceivers over the at least one of the conductors using a modulated signal.

20. The system of claim 18, wherein the controller is configured to utilize the communication to synchronize clocking of the system.

* * * * *